United States Patent
Larson et al.

(10) Patent No.: US 6,934,896 B2
(45) Date of Patent: Aug. 23, 2005

(54) TIME SHIFT CIRCUIT FOR FUNCTIONAL AND AC PARAMETRIC TEST

(75) Inventors: Doug Larson, Santa Clara, CA (US); Anthony Le, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 532 days.

(21) Appl. No.: 10/039,720

(22) Filed: Dec. 31, 2001

(65) Prior Publication Data
US 2003/0126530 A1 Jul. 3, 2003

(51) Int. Cl.[7] .............................................. G01R 31/28
(52) U.S. Cl. ...................................... 714/724; 714/744
(58) Field of Search ......................... 713/500; 714/744, 714/724; 327/263; 365/201

(56) References Cited

U.S. PATENT DOCUMENTS

| | | | | |
|---|---|---|---|---|
| 5,712,855 A | * | 1/1998 | Goto et al. .................. 714/700 |
| 5,811,655 A | * | 9/1998 | Hashimoto et al. .......... 73/1.42 |
| 6,032,282 A | | 2/2000 | Masuda et al. ............. 714/744 |
| 6,058,057 A | | 5/2000 | Ochiai et al. ............... 365/201 |
| 6,073,259 A | * | 6/2000 | Sartschev et al. ........... 714/724 |
| 6,172,544 B1 | * | 1/2001 | Sugamori .................... 327/263 |
| 6,253,360 B1 | * | 6/2001 | Yoshiba ......................... 716/6 |
| 6,263,463 B1 | | 7/2001 | Hashimoto .................. 714/724 |
| 6,457,148 B1 | * | 9/2002 | Yoshiba ...................... 714/718 |
| 6,532,561 B1 | * | 3/2003 | Turnquist et al. ........... 714/738 |

* cited by examiner

*Primary Examiner*—Guy J. Lamarre
*Assistant Examiner*—John P. Trimmings
(74) *Attorney, Agent, or Firm*—Muramatsu & Associates

(57) ABSTRACT

A time shift circuit for changing a delay timing of a portion of a test pattern for testing a semiconductor device. The time shift circuit includes a multiplexer for selectively producing delay value data indicating a value of time shift in response to a shift command signal, a vernier delay unit for producing timing vernier data based on the delay value data selected by the multiplexer, and a timing generator for generating a timing edge for the specific portion of the test pattern based on the timing vernier data from the vernier delay unit. The shift command signal sets either a normal mode where predetermined delay value data is selected by the multiplexer or a time shift mode where delay value data for shifting the timing edge in real time is selected by the multiplexer.

7 Claims, 7 Drawing Sheets

TIME SHIFT CIRCUIT FOR FUNCTIONAL AND AC PARAMETRIC TEST

FIELD OF THE INVENTION

This invention relates to a semiconductor test system for testing semiconductor devices, and more particularly, to a time shift circuit for shifting timings of test signals generated by the semiconductor test system for functional and AC parametric test of semiconductor devices.

BACKGROUND OF THE INVENTION

In testing semiconductor devices by a semiconductor test system (IC tester), the basic procedure of functionally testing of a semiconductor device contains creation of input (drive) stimulus for the device, application of these stimulus and comparison of the output with expected results stored in the test system memory.

For the input application, the test system needs to drive (apply test signals to) inputs of the device under test (DUT) at designated times. Similarly, for measuring the outputs of the device under test, the test system needs to strobe device outputs at a precise time. The timing of input stimulus and strobes is critical in obtaining the correct result and to avoid false pass/fail of the device under test. Hereafter, such input (drive) stimulus or test signals and strobes are also collectively referred to as a test pattern.

Because of the manufacturing process, the actual device outputs are slightly different (even when the device is fault free) from the simulation values or expected results stored in the test system memory. Hence, many times, it is desirable to shift the timing on-the-fly for a portion of the test pattern such as shown in FIGS. 1A–1C. Namely, it is desired that the tester strobes (FIG. 1B) are shifted with respect to the device output (FIG. 1A) only within the time range specified by a shift command signal (FIG. 1C). In other words, it is desirable to dynamically shift a portion of the test pattern to test a specific device output while keeping the normal timing for rest of the test. This feature is desirable for both input stimulus as well as for the strobes at the outputs.

Similarly, for AC parametric test (access time, set-up time, hold time, frequency response, etc. of the device under test), the strobe at device output is continuously shifted until an edge (0-to-1 or 1-to-0 transition) is found. For example, when testing an access time of a certain pin of the device under test, to find out the time length (delay) between a reference point and a rising or falling edge of the pin, the strobe has to be shifted step-by-step to detect the edge.

At the present day semiconductor test system, such timing shift is achieved by running a test pattern multiple times, while each time the strobe timing is modified slightly as illustrated in FIGS. 2A–2E. In this example, the AC test is to measure the response time of the device between the input signal (DUT clock input) shown in FIG. 2A and the edge of the device output shown in FIG. 2B. In the conventional technology, the strobe point of FIG. 2C has to be continuously shifted by producing the test pattern multiple times $M_1$, $M_2$, $M_3$ to measure the delay times $t_1$, $t_2$, $t_3$, respectively. The delay time in FIG. 2D is a time length to detect the rising edge (0 to 1) of the device output and the delay time in FIG. 2E is a time length to detect the falling of the device output.

The foregoing conventional technology is inconvenient and time consuming because the test pattern has to be repeatedly generated while slightly shifting the timing of the particular portion thereof one by one. Further, the conventional method for shifting the timing of the test pattern is costly because it requires a long time to prepare a test program for shifting the time one by one. For improving the test efficiency, there is a need of a new circuit and method for shifting the timing in the test pattern on-the-fly without repeatedly producing the test pattern.

SUMMARY OF THE INVENTION

It is, therefore, an object of the present invention to provide a time shift circuit and method for shifting timings of a portion of the test pattern in real time for testing a semiconductor device.

It is another object of the present invention to provide a time shift circuit and method for dynamically shifting the timings of a desired portion of the test pattern when performing a functional test or an AC parametric test of a semiconductor device.

It is a further object of the present invention to provide a time shift circuit and method which is capable of freely shifting the timings of the test pattern, thereby saving test time and increasing test throughput.

The time shift circuit of the present invention, for a semiconductor test system for changing a delay timing of a portion of a test pattern for testing a semiconductor device, includes a multiplexer for selectively producing delay value data indicating a value of time shift for a specific portion of test pattern in response to a shift command signal, a vernier delay unit for producing timing vernier data based on programmed delay data prepared in the semiconductor test system and the delay value data selected by the multiplexer; and a timing generator for generating a timing edge for the specific portion of the test pattern based on the timing vernier data from the vernier delay unit. The shift command signal sets either a normal mode where predetermined delay value data is selected by the multiplexer or a time shift mode where delay value data for shifting the timing edge in real time is selected by the multiplexer.

Preferably, the vernier delay unit includes an adder for summing the programmed delay data and the selected delay value data from the multiplexer, a decoder for decoding higher bits of output data of the adder to produce a register select signal, and a series of delay registers for delaying the timing vernier data configured by lower bits of the output data of the adder where one of the delay registers is selected by the register select signal to receive the timing vernier data as a first delay register. The timing vernier data is shifted in the series of delay registers starting from the first delay register at each clock, thereby producing the timing vernier data at a timing which is an integer multiple of a clock period.

The time shift circuit is especially useful for an AC parametric test. In such an application, the time shift circuit of the present invention is comprised of a counter for transferring delay value data in a normal mode and incrementing the delay value data in an AC parametric measurement mode to determine a delay timing of a portion of the test pattern applied to a device under test where a mode selection signal selects either the normal mode or the AC parametric measurement mode, a vernier delay unit for producing timing vernier data based on programmed delay data prepared in the semiconductor test system and the delay value data received from the counter, a timing generator for generating a timing edge for the specific portion of the test pattern based on the timing vernier data from the vernier delay unit, means for strobing an output signal of the device under test at the timing edge from the timing generator, and a strobe recovery circuit for determining pass or fail status of the output signal of the device under test and producing a fail signal when the output signal fails.

The fail signal is provided to the counter during the AC parametric measurement mode to increment the delay value data, thereby continuously shifting the timing edge for strobing the output signal of the device under test until a change of state in the output signal is detected.

DETAILED DESCRIPTION OF THE INVENTION

The time shift circuit and method of the present invention will be described in more detail with reference to the accompanying drawings. While the present invention will be described in conjunction with the functional test and AC parametric test of a semiconductor device, it will be understood that the present invention is not limited to such a specific application. For example, the present invention can also be applicable to a normal test when a timing of specific strobe or pattern edge is offset.

Figure 3:
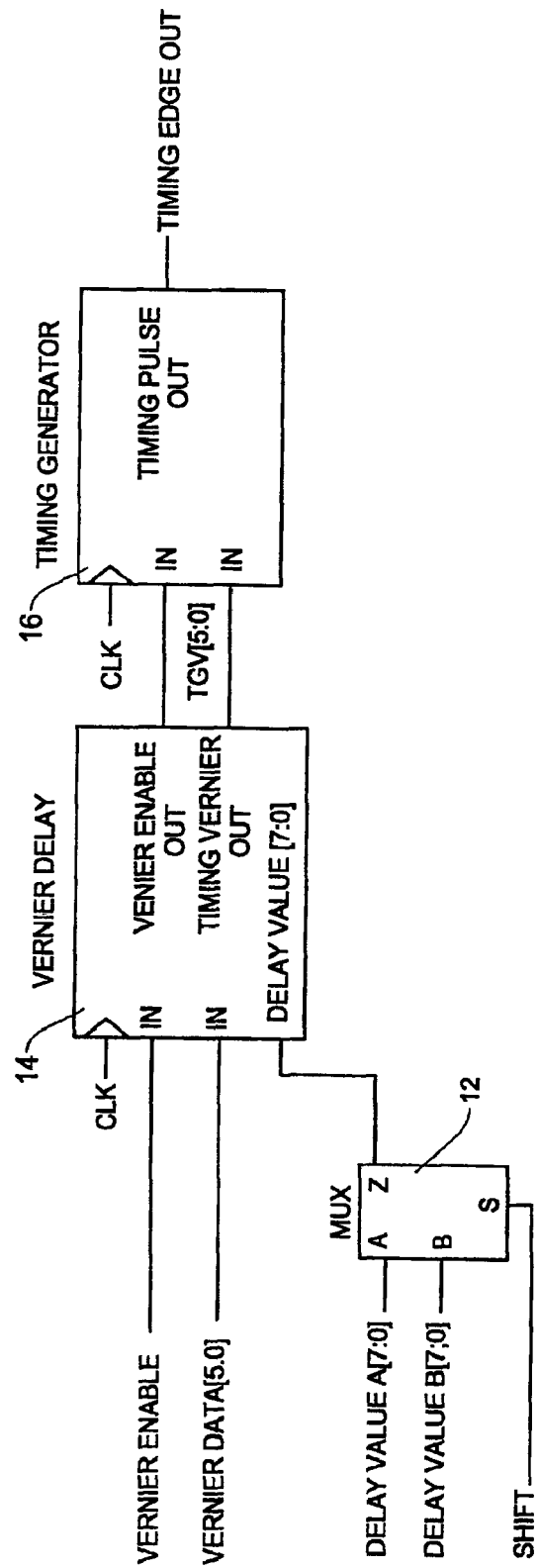
FIG. 3 is a schematic block diagram showing an example of structure of the time shift circuit of the present invention.

The basic structure of the time shift circuit of the present invention is shown in the block diagram of FIG. 3. The time shift circuit changes the times of desired timing edges on-the-fly. The time shift circuit includes a 2-to-1 multiplexer 12, a vernier delay unit 14, and a timing generator 16. In this arrangement, the vernier delay unit 14 provides timing data showing delay values to the timing generator 16 so that the timing generator produces timing edges with specified delay.

The vernier delay unit 14 receives a clock, a vernier enable command signal and vernier data (ex. 6-bit or [5:0]) from, for example, a pattern memory (not shown) programmed prior to the test. The vernier delay unit 14 also receives delay value data (ex. 8-bit or [7:0]) from the multiplexer 12. The vernier delay unit 14 a vernier enable command and timing vernier data (6-bit or [5:01]) to the timing generator 16. The timing generator 16 generates timing edges based on the clock and the timing vernier data from the vernier delay unit 14 when the vernier enable command signal is valid (ex. high).

The multiplexer 12 receives delay value data A [7:0] (8-bit) and delay value data B [7:0] (8-bit) and selectively provides either one of the data to the vernier delay unit 14 in response to a shift command signal. Normally, the multiplexer 12 selects the delay value data A, and when the shift command signal is valid (ex. high), the multiplexer 12 selects the delay value data B.

The operation of the time shift circuit of the present invention is explained below:

Normal Test Mode

In the ordinary functional test mode, the shift command signal is kept low, and the vernier delay unit 14 receives the delay value data A through the multiplexer 12. The vernier delay unit 14 delays the vernier data [5:0] by the value specified in the delay value data A [7:0]. The timing generator 16 receives the delayed data, and generates a timing edge for drive stimulus or DUT strobe.

Shifted Test Mode

When a time shift is required in the functional test mode, the shift command signal is made high. In this situation, the vernier delay unit 14 receives the delay value data B [7:0] through the multiplexer 12. Thus, the vernier delay unit 14 delays the vernier data [5:0] from the pattern memory by the delay value data B. The timing generator 16 receives the delayed strobe (or drive) data, and generates a timing edge for drive stimulus or DUT strobe.

Time Shift Values

The two delay values, the delay value data A [7:0] and the delay value data B [7:0], are pre-determined by the user before the start of the test. These values are used by controlling the shift command signal on-the-fly during the testing. A user may also use programmable counters or test patterns to control the shift command signal.

It should be noted that any field width can be used for the vernier data, delay value data A and delay value data B, in other words, the values shown in FIG. 3 are just one implementation done by the assignee. The use of the dynamic shift feature allows time shifting without changing the data in the pattern memory or without repeatedly generating the test patterns.

Figure 4:
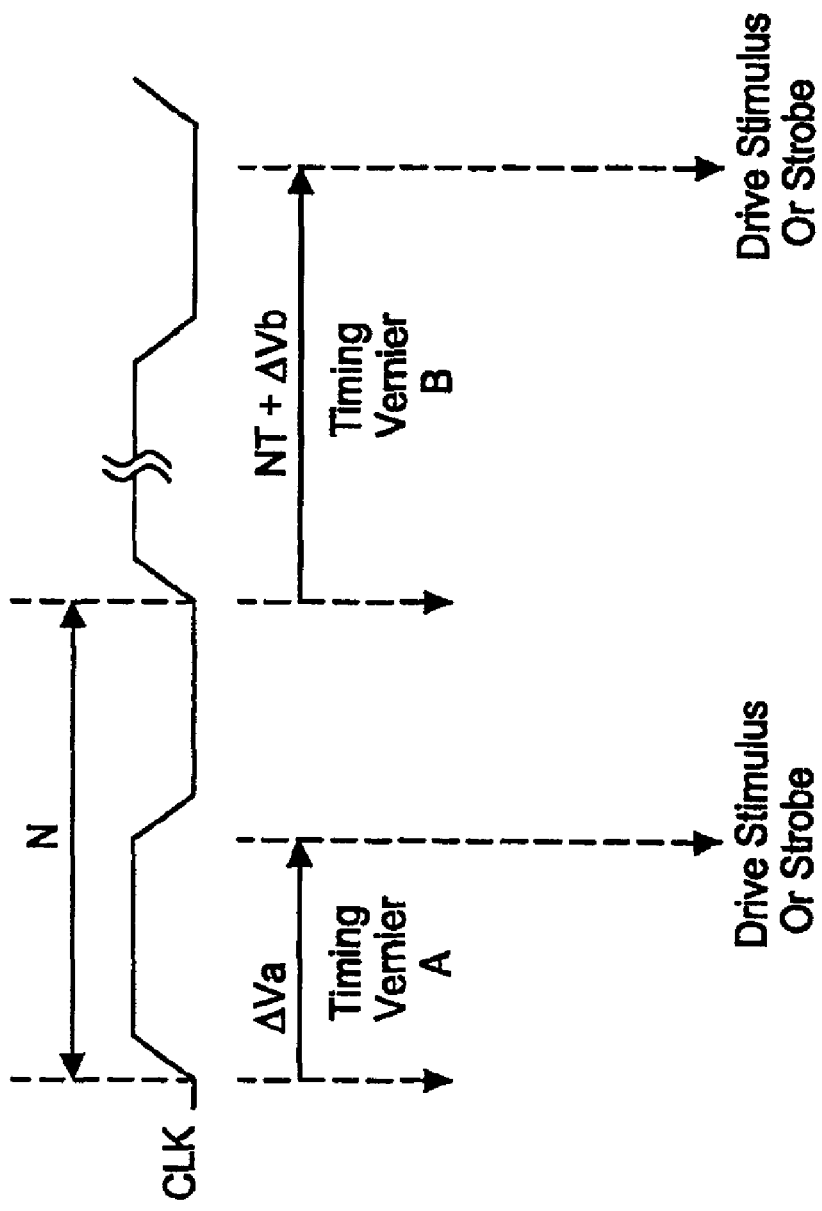
FIGS. 4A and 4B are timing charts showing example of delay timings created in the vernier delay unit in the time shift circuit in the present invention.

The concept described above allows a continuous time shift based upon the delay value data. In actual testing, the IC tester also requires a fine resolution that is much smaller than the tester clock period and a time delay adjustment range for both drive and strobe actions that is larger than the tester clock period. Conceptually, this requirement is illustrated in FIGS. 4A and 4B. FIG. 4B shows two different timing verniers A and B, each referenced to the tester clock edge of FIG. 4A. The timing vernier A has a delay $\Delta Va$ which i8 smaller than the tester clock period T. The timing vernier B has a delay $NT\Delta Vb$ which is larger than the tester clock period T.

Figure 5:
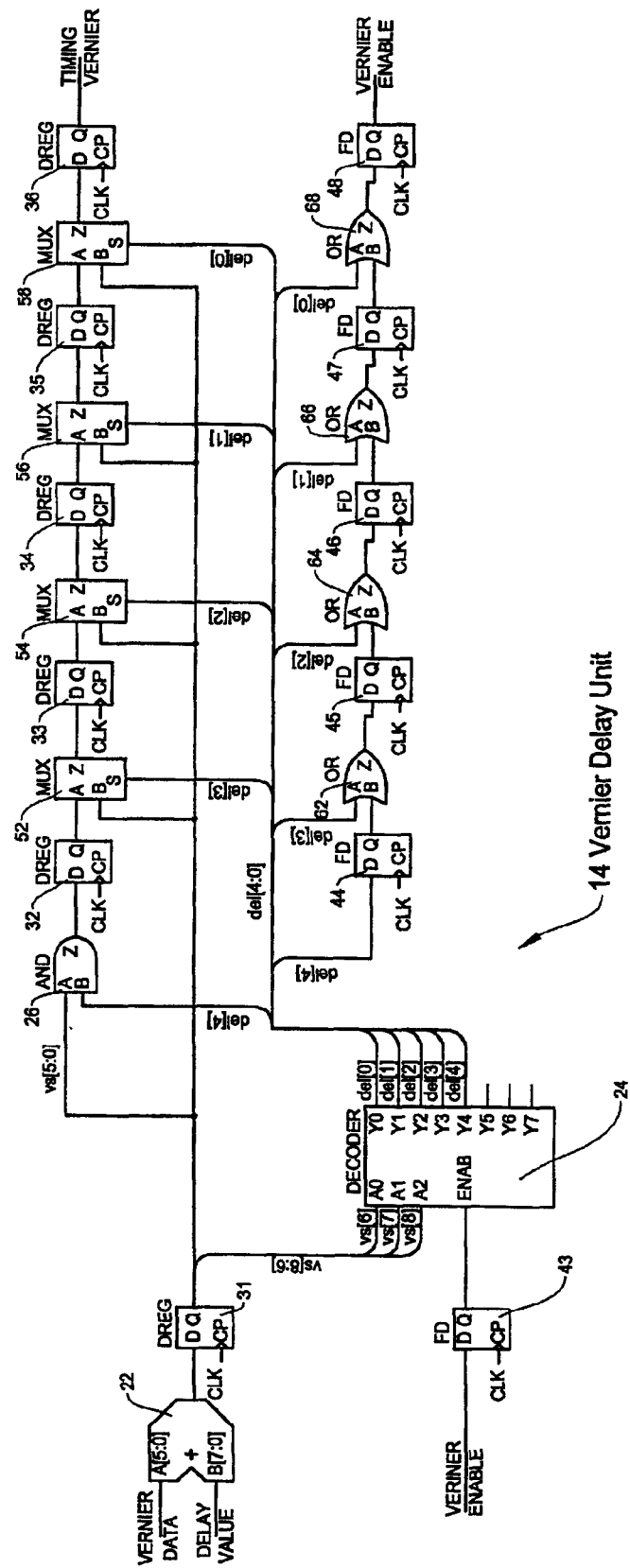
FIG. 5 is a circuit diagram showing an example of structure in the vernier delay unit of the present invention incorporated in the time shift circuit of FIG. 3.

FIG. 5 is a circuit diagram showing an example of structure in the vernier delay unit 14 for generating the timing verniers shown in FIG. 4B. The vernier delay unit 14 allows delay in timing vernier data over many tester clock periods, with the resolution equal to the fine vernier timing resolution, i.e., a fraction of the tester clock period.

The vernier delay unit 14 in FIG. 5 incudes an adder 22, a decoder 24, an AND gate 26, delay registers (D flip-flops) 31–36 and flip-flops 43–48, OR gates 62, 64, 66 and 68, and multiplexers 52, 54, 56 and 58. The vernier delay unit 14 receives the vernier data from the pattern memory and the delay value data from the multiplexer 12 in FIG. 3 at the adder 22. The vernier delay unit 14 also receives the vernier enable signal and the clock at the flip-flop 43.

The input delay data controls the amount of time delay between input and output, and has the same time resolution as the vernier. In this example, the vernier has 6-bit resolution, with 64 steps in one tester clock period. The adder 22 sums the vernier data and the delay value data A or delay value data B selected by the multiplexer 22 of FIG. 3. The resulting 9-bit value is split into two fields. The most significant three bits vs[8:6] determines the number of whole clock periods to delay, while the lower bits, vs[5:0] form the new vernier delay value.

The decoder 24 decodes the most significant bits vs[8:6] and the vernier enable, and sets one bit of the output del[4:0] high (register select signal). This selects an appropriate delay register that receives the new vernier value as a first delay register, vs[5:0], and starts the vernier enable pipeline. Thus, the vernier value vs[5:0] is shifted starting from the first delay register every time the clock pulse is given to the delay registers 32–36, thereby producing the timing vernier data TGV[5:0] at the output at a timing which is an integer multiple of the clock. This example shows the timing vernier with 6-bits, but any bit width can be used. The total delay range can also be changed to any amount, by increasing the width of delay value [N:0] and adding delay registers to support the greater time delay.

This circuit operates at the full clock rate, and can accept one new vernier value every clock period. It can delay the input verniers by many clock periods, yet the timing generator that follows this circuit only needs to cover one complete clock period. The incoming verniers must be at least one clock period apart in time. The delay may also be varied at the clock rate.

AC Parametric Test

Figure 6:
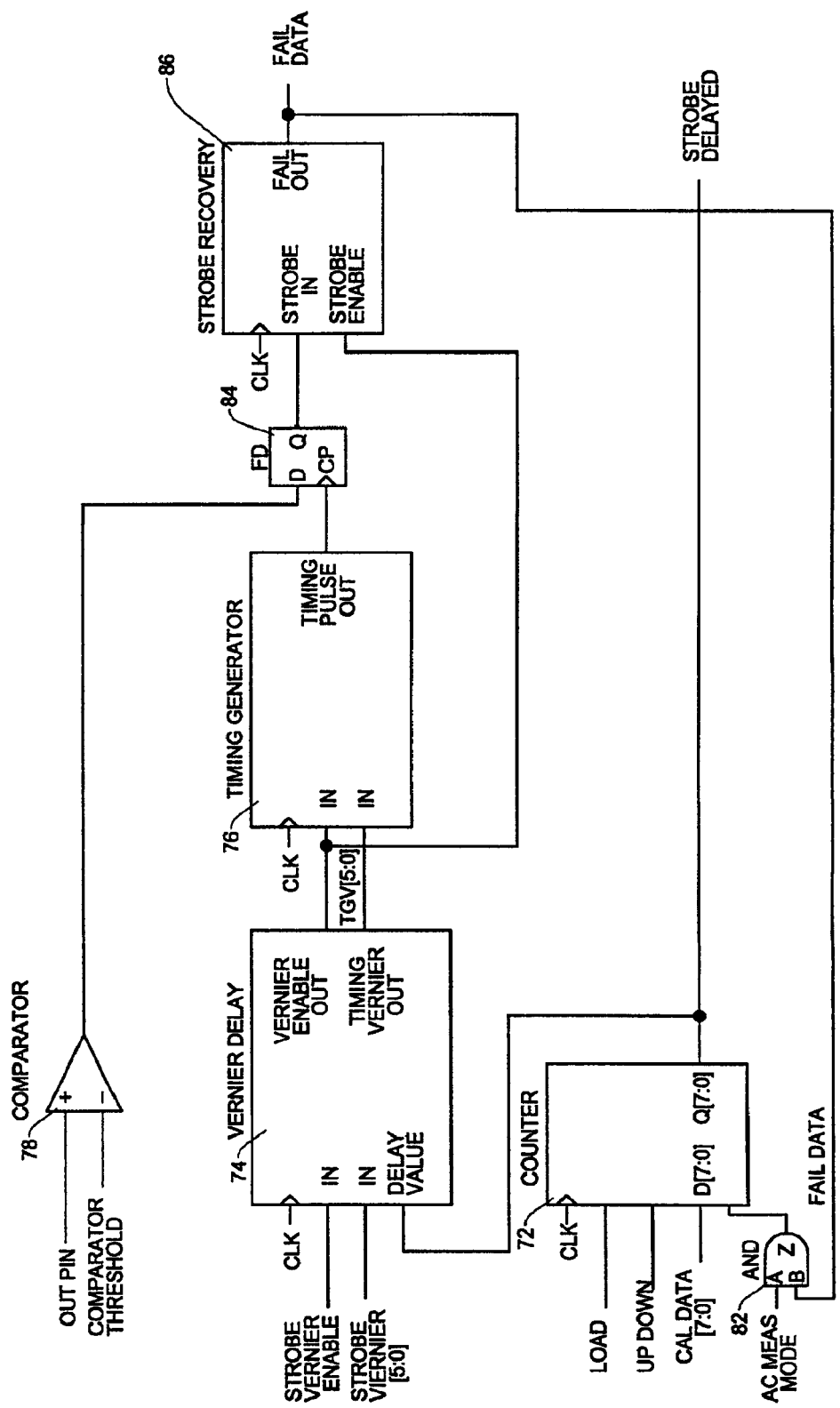
FIG. 6 is a schematic block diagram showing an example of structure of the time shift circuit of the present invention arranged for AC parametric test.

The above concept of time shift in stimulus and strobe can be used to facilitate AC parametric testing. As mentioned above, in an AC parametric test, the timing of the strobe is varied until an edge is found in the output signal from the device pin. FIG. 6 shows the overall circuit schematics that allows of this measurement using one test pattern run.

In the example of FIG. 6, the time shift circuit includes a comparator 78, a vernier delay unit 74, a timing generator 76, a counter 72, a strobe recovery circuit 86, an AND gate 82 and a flip-flop 84. The vernier delay unit 74 and the timing generator 76 are basically the same as the vernier delay unit 14 and the timing generator 16, respectively, in FIG. 3. The vernier delay unit 74 receives a strobe vernier enable signal and strobe vernier data from an appropriate source such as a pattern memory in an IC tester. The vernier delay unit 74 also receives delay value data from the counter 72 which is added to the strobe vernier data as described in the foregoing with reference to FIGS. 3 and 5.

The comparator 78 receives an output signal of an output pin of the device under test and a threshold voltage for comparing the output signal to determine logic state "0" or "1" of the output signal. A load signal, an up/down signal, and skew calibration data (8-bit, i.e., [7:0]) are provided to the counter 72. An AC measurement mode signal (mode selection signal) is provided to the AND gate 82 which determines the operating mode of the circuit of FIG. 6. The load signal loads the skew calibration data in the counter 72. The up/down signal determines an up count or down count operation in the counter 72. The AC measurement mode signal (mode selection signal) switches between the normal functional test mode and the AC parametric measurement mode.

Normal Functional Test Mode

The skew calibration data is loaded in the counter 72 when the load signal is high. In the normal functional test mode, the AC mode signal is low, and the counter 72 does not count. The counter transfers the calibration data [7:0] to the vernier delay unit 74 as strobe delay value data [7:0] as fixed data. Thus, in the normal functional test mode, the circuit block of FIG. 6 operates at a fixed time delay, delaying the strobe vernier data [5:0] by the strobe delay value data [7:0]. The timing generator 76 receives the delayed strobe data, and generates a timing edge for sampling the comparator output by the flip-flop 84. The strobe recovery circuit 86 determines pass or fail status of the device pin, and outputs the result such as fail data (fail signal). The fail signal is also supplied to the counter 72 through the AND gate 82.

AC Parametric Measurement Mode

In the AC parametric measurement mode, the AC measurement mode signal is high, and the counter 72 is allowed to count. The counter 72 is initialized by writing zero. When a test pattern is run, a strobe failure through the AND gate 82 increments the counter 72 by one. Thus as in FIG. 2C, the strobe is continuously shifted in time during the time $t_1$, $t_2$ and $t_3$ until the device output signal changes the logic state. During such a time period, the time shift circuit of FIG. 6 produces a failure for each strobe until the edge is detected in the device output signal. Thus, a test pattern with many strobes will increment the counter 72 many times, until no more failures are found. Then the strobe delay value data [7:0] will contain the exact minimum value required to allow the test pattern to pass. The strobe delay value data [7:0] can be read to determine what the device delay times are, by comparing the AC parametric test value to the calibration value.

It should be noted that this time shift circuit is not limited to incrementing strobe times. It may also be used to vary the timings of the input stimulus. In such a situation, the timing generator 76 creates an edge for drive-high or drive-low, instead of a strobe sampling edge. The pass/fail information for incrementing the counter 72 must be fed back from another tester pin. Further, it should be noted that the circuit is not limited to incrementing values. The counter can be configured with the up/down signal as noted above, and used to either increment or decrement. Also, the count change may occur on either a pass or fail.

Figure 1:
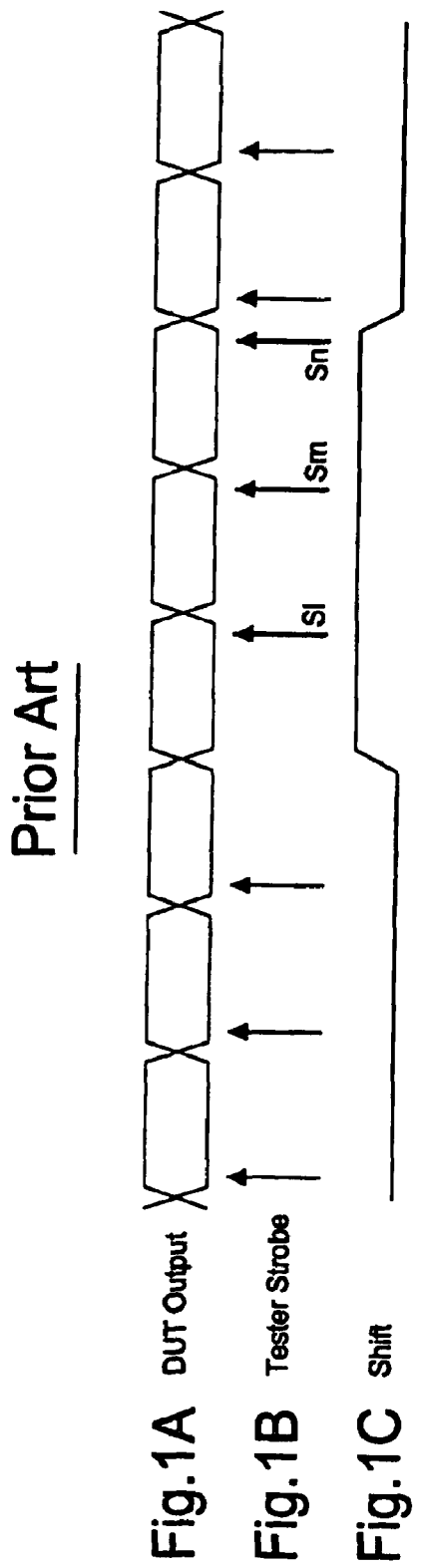
FIGS. 1A–1C are timing charts showing the timing relationship between the device output and the strobes and needs of timing shift in the strobes.
Figure 2:
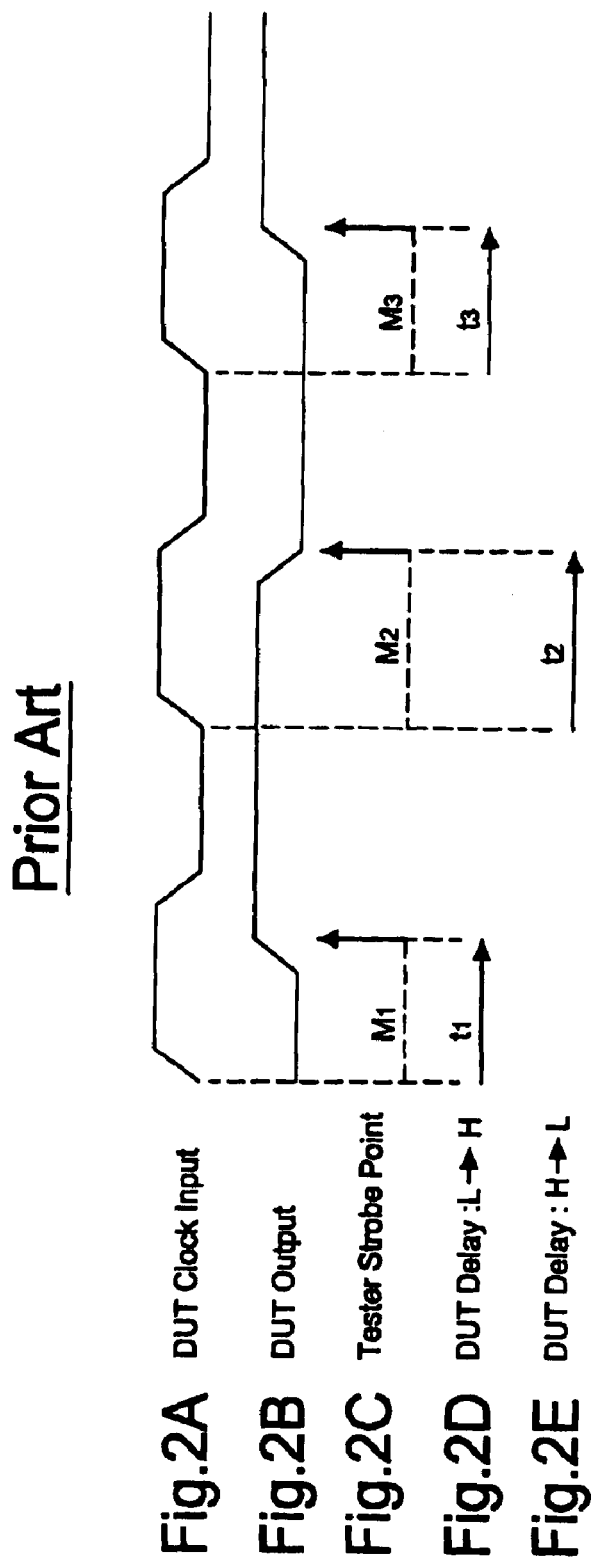
FIGS. 2A–2E are timing charts showing the timing relationship among the device input, device output and the strobes, and the manner of time shift in the conventional semiconductor test system.

The AC measurement requires a sufficient number of test strobes or drive stimulus such as $M_1$, $M_2$ and $M_3$ in FIG. 2C to ensure that the counter has reached the correct value. In the present invention, such a plurality of strobes or drive stimulus can be generated without repeating the test run. If a test pattern has a small number of strobes, then the test pattern may have to be run several times to find the correct strobe delay value [7:0]. Although this circuit example shows specific widths for the strove delay value data [7:0] and the strobe vernier data [5:0], any data width can be used.

Figure 7:
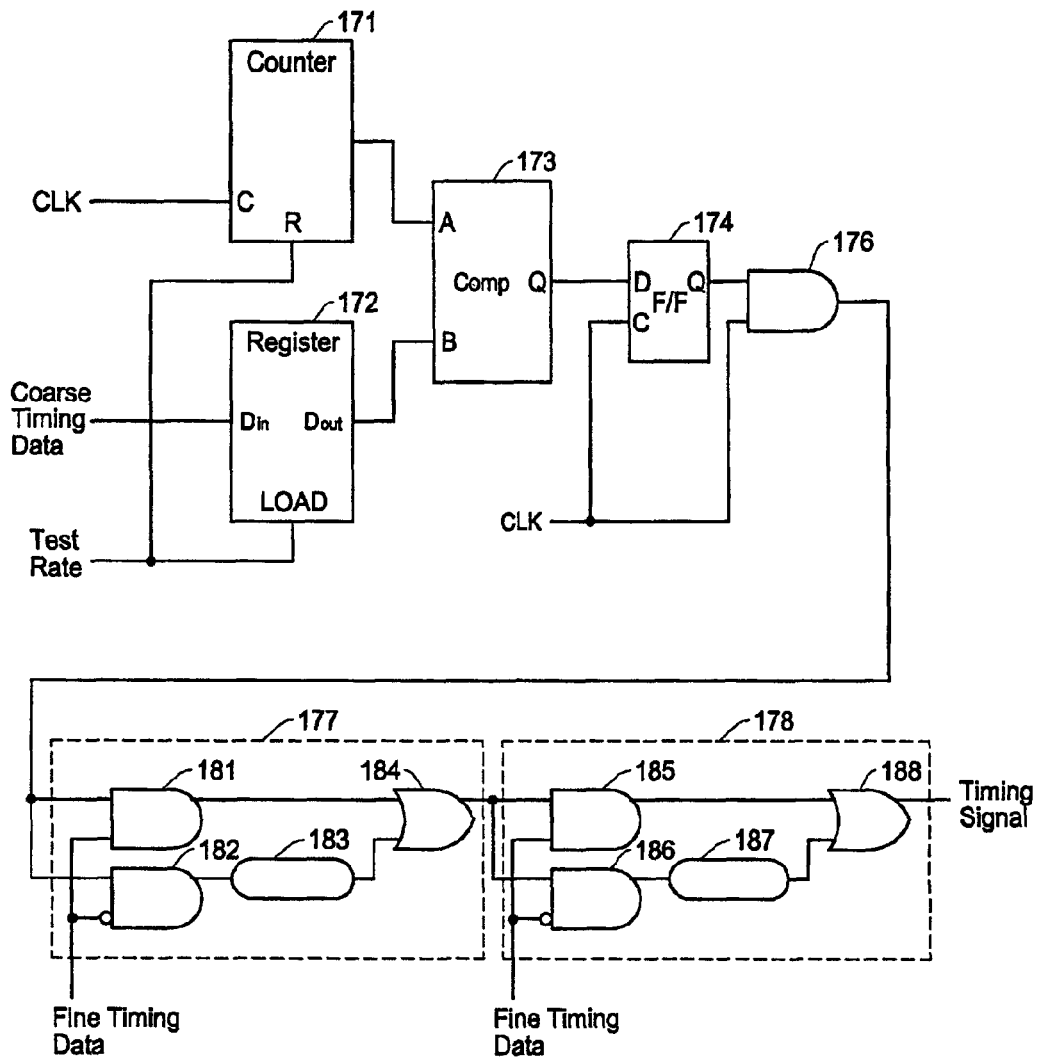
FIG. 7 shows an example of structure in the timing generator that can be used in the time shift circuit of the present invention.

FIG. 7 shows an example of timing generator that can be used in the time shift circuit of the present invention. In this example, the timing generator is formed of a coarse delay circuit and a fine delay circuit. For example, the coarse delay circuit produces a delay time which is an integer multiple of one clock signal period while the fine delay circuit produces a delay time which is a fraction of the one clock signal period.

The coarse delay circuit receives coarse timing data which is, for example, higher bits of the timing vernier from the vernier delay unit 14 or 74. The coarse delay circuit may not be necessary when the timing vernier from the vernier delay unit has a suitable delay with an intended multiple time of the clock period. The fine delay circuit receives fine timing data which is, for example, lower bits of the timing vernier.

The upper part of FIG. 7 is the coarse delay circuit and the lower part thereof is the fine delay control circuit. In the example of FIG. 7, the coarse delay circuit is formed of a counter 171, a register 172, a comparator 173, a flip-flop 174 and an AND gate 176. In the coarse delay circuit, the counter 171 is reset by a tester rate signal and the coarse timing (delay) data is loaded in the register 172. The counter 171 counts the clock signal. The counted data of the counter 171 is compared with the coarse delay data stored in the register 172 by the comparator 173.

When both data match with each other, the comparator 173 produces a coincidence signal which is re-timed by the flip-flop 174 and the AND gate 176. Thus, the output of the AND gate 176 shows a delay time which is an integer multiple of the clock period. The delayed output signal from the AND gate 176 is provided with a delay time which is smaller than the clock cycle by the fine delay circuit.

The fine delay circuit is configured by a plurality of variable delay circuits for producing weighted small delay times. In the example of FIG. 7, the fine delay circuit includes a delay unit 177 for generating a delay time equal to a ½ cycle of the clock signal and a delay unit 178 for generating a delay time equal to a ¼ cycle of the clock signal. The delay unit 177 is formed of AND gates 181 and 182, a delay element 183, and an OR gate 184. Similarly, the delay circuit 178 is formed of AND gates 185 and 186, a delay element 187, and an OR gate 188.

The delay elements 183 and 187 respectively produce the above noted delay times which are ½ cycle and ¼ cycle, respectively, of the clock signal. Such delay times are created, for example, by combinations of signal propagation delay times of many CMOS transistors or gates forming the delay elements 183 and 187.

As shown in the circuit configuration of FIG. 7, by the fine timing data provided to the AND gates, it is determine as to whether or not the input signal to the delay circuit is introduced to the signal path having the delay element for adding the delay time. As a consequence, at the output of the timing generator of FIG. 7, a timing signal having a high timing resolution is produced. In an actual application to a semiconductor test system, a large number of such delay circuits are employed to produce a fine delay time having timing resolution of, for example, 1/32 cycle of the reference clock.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A time shift circuit for a semiconductor test system for changing a delay timing of a portion of a test pattern for testing a semiconductor device, comprising:

a multiplexer for selectively producing delay value data indicating a value of time shift for a specific portion of test pattern in response to a shift command signal;

a vernier delay unit for producing timing vernier data based on programmed delay data prepared in the semiconductor test system and the delay value data selected by the multiplexer; and a timing generator for generating a timing edge for the specific portion of the test pattern based on the timing vernier data from the vernier delay unit;

wherein the shift command signal sets either a normal mode where predetermined delay value data is selected by the multiplexer or a time shift mode where delay value data for shifting the timing edge in real time is selected by the multiplexer; and wherein the vernier delay unit, comprising:

an adder for summing the programmed delay data and the selected delay value data from the multiplexer;

a decoder for decoding higher bits of output data of the adder to produce a register select signal; and a series of delay registers for delaying the timing vernier data configured by lower bits of the output data of the adder where one of the delay registers is selected by the register select signal to receive the timing vernier data as a first delay register.

2. A time shift circuit as defined in claim 1, wherein the timing vernier data is shifted in the series of delay registers starting from the first delay register at each clock, thereby producing the timing vernier data at a timing which is an integer multiple of a clock period.

3. A time shift circuit as defined in claim 1, wherein the timing generator includes a fine delay circuit for receiving the timing vernier from the vernier delay unit and producing a delay time which is smaller than one cycle of the clock based on the timing vernier data.

4. A time shift circuit for a semiconductor test system for changing a delay timing of a portion of a test pattern for testing a semiconductor device, comprising:

a counter for transferring delay value data in a normal mode and incrementing the delay value data in an AC parametric measurement mode to determine a delay timing of a portion of the test pattern applied to a device under test where a mode selection signal selects either the normal mode or the AC parametric measurement mode;

a vernier delay unit for producing timing vernier data based on programmed delay data prepared in the semiconductor test system and the delay value data received from the counter;

a timing generator for generating a timing edge for the specific portion of the test pattern based on the timing vernier data from the vernier delay unit;

means for strobing an output signal of the device under test at the timing edge from the timing generator; and a strobe recovery circuit for determining pass or fail status of the output signal of the device under test and producing a fail signal when the output signal fails;

wherein the fail signal is provided to the counter during the AC parametric measurement mode to increment the delay value data, thereby continuously shifting the timing edge for strobing the output signal of the device under test until a change of state in the output signal is detected.

5. A time shift circuit as defined in claim 4, wherein the vernier delay unit, comprising:

an adder for summing the programmed delay data and the selected delay value data;

a decoder for decoding higher bits of output data of the adder to produce a register select signal; and a series of delay registers for delaying the timing vernier data configured by lower bits of the output data of the adder where one of the delay registers is selected by the register select signal to receive the timing vernier data as a first delay register.

6. A time shift circuit as defined in claim 5, wherein the timing vernier data is shifted in the series of delay registers starting from the first delay register at each clock, thereby producing the timing vernier data at a timing which is an integer multiple of a clock period.

7. A time shift circuit as defined in claim 4, wherein the timing generator includes a fine delay circuit for receiving the timing vernier from the vernier delay unit and producing a delay time which is smaller than one cycle of the clock based on the timing vernier data.

* * * * *